(12) United States Patent
Haberecht et al.

(10) Patent No.: US 11,982,015 B2
(45) Date of Patent: May 14, 2024

(54) METHOD FOR DEPOSITING AN EPITAXIAL LAYER ON A FRONT SIDE OF A SEMICONDUCTOR WAFER, AND DEVICE FOR CARRYING OUT THE METHOD

(71) Applicant: SILTRONIC AG, Munich (DE)

(72) Inventors: Joerg Haberecht, Freiberg (DE); Stephan Heinrich, Freiberg (DE); Reinhard Schauer, Laufen (DE); Rene Stein, Bobritzsch-Hilbersdorf (DE)

(73) Assignee: SILTRONIC AG, Munich (DE)

( * ) Notice: Subject to any disclaimer, the term of this patent is extended or adjusted under 35 U.S.C. 154(b) by 224 days.

(21) Appl. No.: 17/614,214

(22) PCT Filed: Apr. 29, 2020

(86) PCT No.: PCT/EP2020/061882
§ 371 (c)(1),
(2) Date: Nov. 24, 2021

(87) PCT Pub. No.: WO2020/239347
PCT Pub. Date: Dec. 3, 2020

(65) Prior Publication Data
US 2022/0267926 A1    Aug. 25, 2022

(30) Foreign Application Priority Data
May 28, 2019   (DE) ............. 10 2019 207 772.2

(51) Int. Cl.
C30B 25/12 (2006.01)
C23C 16/458 (2006.01)
C23C 16/46 (2006.01)
C30B 25/10 (2006.01)
H01L 21/02 (2006.01)
(Continued)

(52) U.S. Cl.
CPC .......... *C30B 25/12* (2013.01); *C23C 16/4584* (2013.01); *C23C 16/46* (2013.01); *C30B 25/105* (2013.01); *H01L 21/0262* (2013.01); *H01L 21/68764* (2013.01); *H01L 23/544* (2013.01); *H01L 2223/54493* (2013.01)

(58) Field of Classification Search
CPC ... C30B 25/12; C30B 25/105; C23C 16/4584; H01L 21/0262; H01L 21/68764; H01L 23/544; H01L 2223/54493
See application file for complete search history.

(56) References Cited

U.S. PATENT DOCUMENTS 9,401,271 B2    7/2016  Pitney et al.
2007/0026148 A1  2/2007  Arai et al.
(Continued)

FOREIGN PATENT DOCUMENTS

CN    101111934 A    1/2008
CN    205821452 U   12/2016
(Continued)

*Primary Examiner* — Robert M Kunemund
(74) *Attorney, Agent, or Firm* — BROOKS KUSHMAN P.C.

(57) ABSTRACT

Variations in wafer thickness due to non-uniform CVD depositions at angular positions corresponding to crystallographic orientation of the wafer are reduced by providing a ring below the susceptor having inward projections at azimuthal positions which reduce radiant heat impinging upon the wafer at positions of increased deposition.

10 Claims, 10 Drawing Sheets

(51) Int. Cl.
*H01L 21/687* (2006.01)
*H01L 23/544* (2006.01)

(56) References Cited

U.S. PATENT DOCUMENTS

| | | |
|---|---|---|
| 2007/0227441 A1 | 10/2007 | Narahara et al. |
| 2008/0118712 A1 | 5/2008 | Schauer et al. |
| 2012/0270407 A1* | 10/2012 | Werner ............. H01L 21/68735 438/758 |
| 2014/0251208 A1 | 9/2014 | Samir et al. |
| 2014/0283748 A1 | 9/2014 | Higashi et al. |
| 2015/0184314 A1 | 7/2015 | Narahara et al. |
| 2017/0117228 A1 | 4/2017 | Schauer et al. |
| 2018/0002830 A1 | 1/2018 | Yudovsky et al. |
| 2020/0144035 A1 | 5/2020 | Wu et al. |
| 2020/0294794 A1 | 9/2020 | Haberecht et al. |
| 2020/0318234 A1* | 10/2020 | Haberecht ............... C30B 29/06 |
| 2020/0365443 A1 | 11/2020 | Schauer |
| 2022/0267926 A1 | 8/2022 | Haberecht et al. |

FOREIGN PATENT DOCUMENTS

| | | |
|---|---|---|
| CN | 109451743 A | 3/2019 |
| CN | 213538160 U | 6/2021 |
| JP | 2004217809 A | 8/2004 |
| JP | 2005207997 A | 8/2005 |
| JP | 2007214531 A | 8/2007 |
| JP | 2009088088 A | 4/2009 |
| JP | 2014212244 A | 11/2014 |
| JP | 2015516685 A | 6/2015 |
| JP | 2017195301 A | 10/2017 |
| TW | 201715641 A | 5/2017 |
| TW | 201839187 A | 11/2018 |
| TW | 201906064 A | 2/2019 |
| WO | 2006068805 A1 | 6/2006 |
| WO | 2019110386 A1 | 6/2019 |

* cited by examiner

METHOD FOR DEPOSITING AN EPITAXIAL LAYER ON A FRONT SIDE OF A SEMICONDUCTOR WAFER, AND DEVICE FOR CARRYING OUT THE METHOD

CROSS REFERENCE TO RELATED APPLICATIONS

This application is the U.S. National Phase of PCT Appln. No. PCT/EP2020/061882 filed Apr. 29, 2020, which claims priority to German Application No. 10 2019 207 772.2 filed May 28, 2019, the disclosures of which are incorporated in their entirety by reference herein.

BACKGROUND OF THE INVENTION

1. Field of the Invention

The subject matter of the invention is a method for depositing an epitaxial layer on the front side of a wafer composed of monocrystalline material, this involving a provided wafer being arranged on a susceptor and being heated to a deposition temperature by means of thermal radiation and a deposition gas being conducted across a front side of the wafer. The subject matter of the invention is furthermore a device for depositing an epitaxial layer on a front side of a wafer composed of monocrystalline material.

2. Description of the Related Art

The deposition of an epitaxial layer on the front side of a wafer is usually done by means of CVD (chemical vapour deposition) in a CVD reactor, often in a single-wafer reactor. Such a CVD reactor is described in US 2014/0 251 208 A1 for example. Provided in a single-wafer reactor between an upper and a lower dome is a reaction space in which a susceptor is held by susceptor support arms of a susceptor support shaft on susceptor support pins. The susceptor and a wafer rested on top is heated by means of thermal radiation by lamp arrays arranged above and below the domes, while a deposition gas is conducted across the front side of the wafer that is facing the upper dome.

US 2008/0118712 A1 describes a susceptor comprising a susceptor ring and a susceptor base. The susceptor ring has a ledge for resting a wafer in the edge region of the back side of the wafer. The susceptor ring is rested on the susceptor base in order to deposit a layer on the front side of the wafer.

US 2007/0227441 A1 refers to periodic variations in thickness in the edge region of epitaxially coated silicon wafers. This is because of the different growth rates with which the epitaxial layer grows. The different growth rates are linked to the crystal orientation of the front side of the wafer. The front side of the wafer is that face of the wafer on which the epitaxial layer is deposited. To homogenize the thickness of the epitaxial layer in the edge region, US 2007/0227441 A1 proposes that the structure of the susceptor be changed with the period of variations in thickness.

With the same goal, US 2015/0184314 A1 proposes limiting the width of the edge region of the wafer. This teaching takes no account of the fact that wafers in which the mentioned variations in thickness are regarded as problematic are provided with an orientation notch in the edge region. In the case of silicon wafers with <100> orientation of the front side, the orientation notch is usually situated on one of the four sites at which an epitaxial layer grows comparatively rapidly and marks one of four <110> crystal directions. Occasionally, the orientation notch is also situated 45° away from such a site and marks one of four <100> crystal directions.

It is an object of the present invention to improve the flatness of wafers having a deposited epitaxial layer in the edge region, especially in the region of the notch, and, at the same time, to reduce periodic variations in thickness in the edge region without having to change, to this end, the susceptor or the shape of the edge region of the wafer.

The object of the invention is achieved by the methods and devices described in the claims.

The features specified with regard to the above-mentioned embodiments of the method according to the invention can be applied mutatis mutandis to the device according to the invention. Conversely, the features specified with regard to the above-mentioned embodiments of the device according to the invention can be applied mutatis mutandis to the method according to the invention. These and other features of the embodiments according to the invention are elucidated in the description of the figures and in the claims. The individual features can be realized either separately or in combination as embodiments of the invention. Furthermore, they can describe advantageous designs which are independently protectable.

SUMMARY OF THE INVENTION

A device for depositing an epitaxial layer onto a front side of a wafer having an orientation notch contains a rotatable support shaft and susceptor support arms for holding and rotating a susceptor comprising a susceptor ring having a resting face for receiving the wafer and supporting the wafer in an edge region thereof. A ring held by the susceptor support arms lies below and spaced apart from the susceptor ring. This ring has azimuthal projections which reduce deposition along crystal orientations having increased deposition rates, resulting in wafers having improved thickness uniformities at these azimuthal positions.

DETAILED DESCRIPTION OF THE PREFERRED EMBODIMENTS

Figure 1:
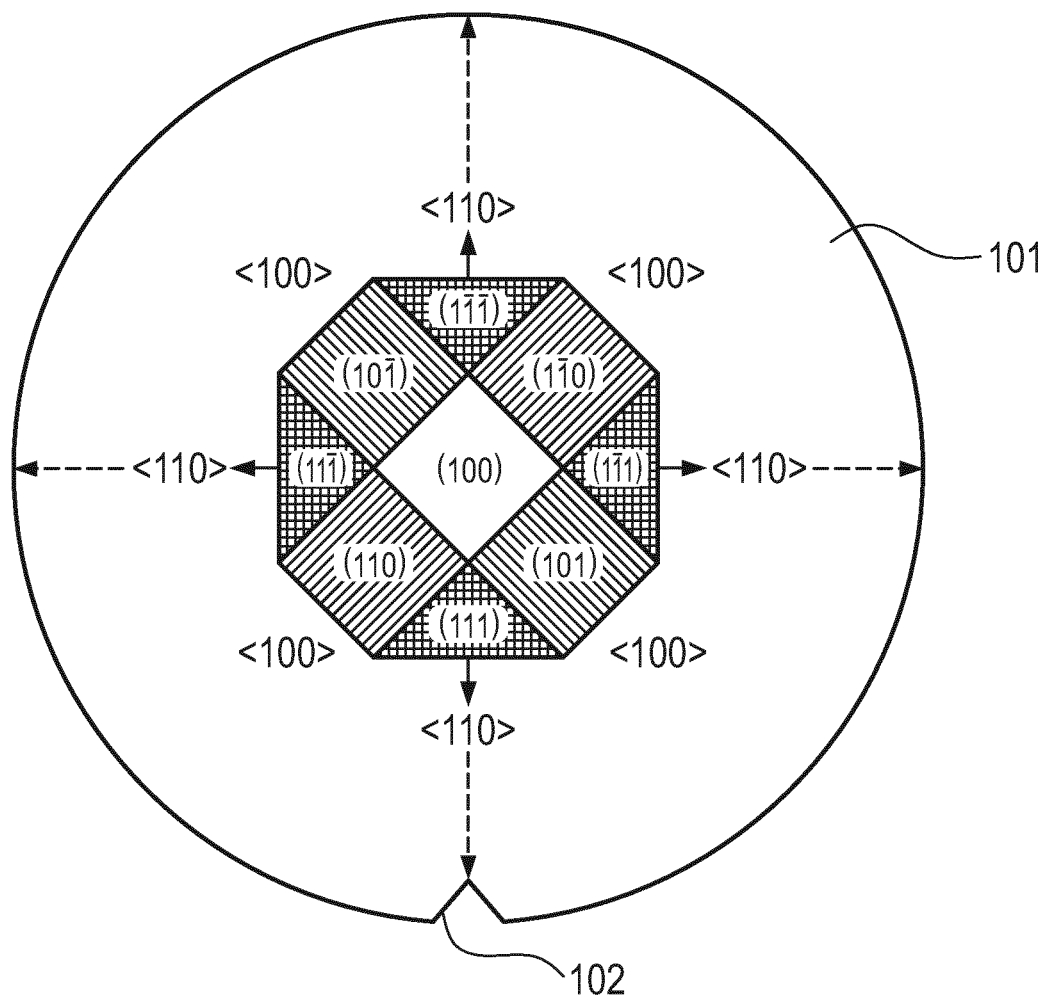
FIG. 1 shows a wafer (101) having an orientation notch (102). The wafer (101) has a <100> orientation. The upper face of the wafer (101) is, for example, the (100) plane. The orientation notch 102 marks one of four <110> crystal directions which, distributed around the circumference of the wafer at an interval of 90°, point to corresponding planes in the region of the edge of the wafer, on which planes an epitaxial layer grows at a comparatively higher rate than on planes in the region of the edge to which four <100> crystal directions point.
Figure 2:
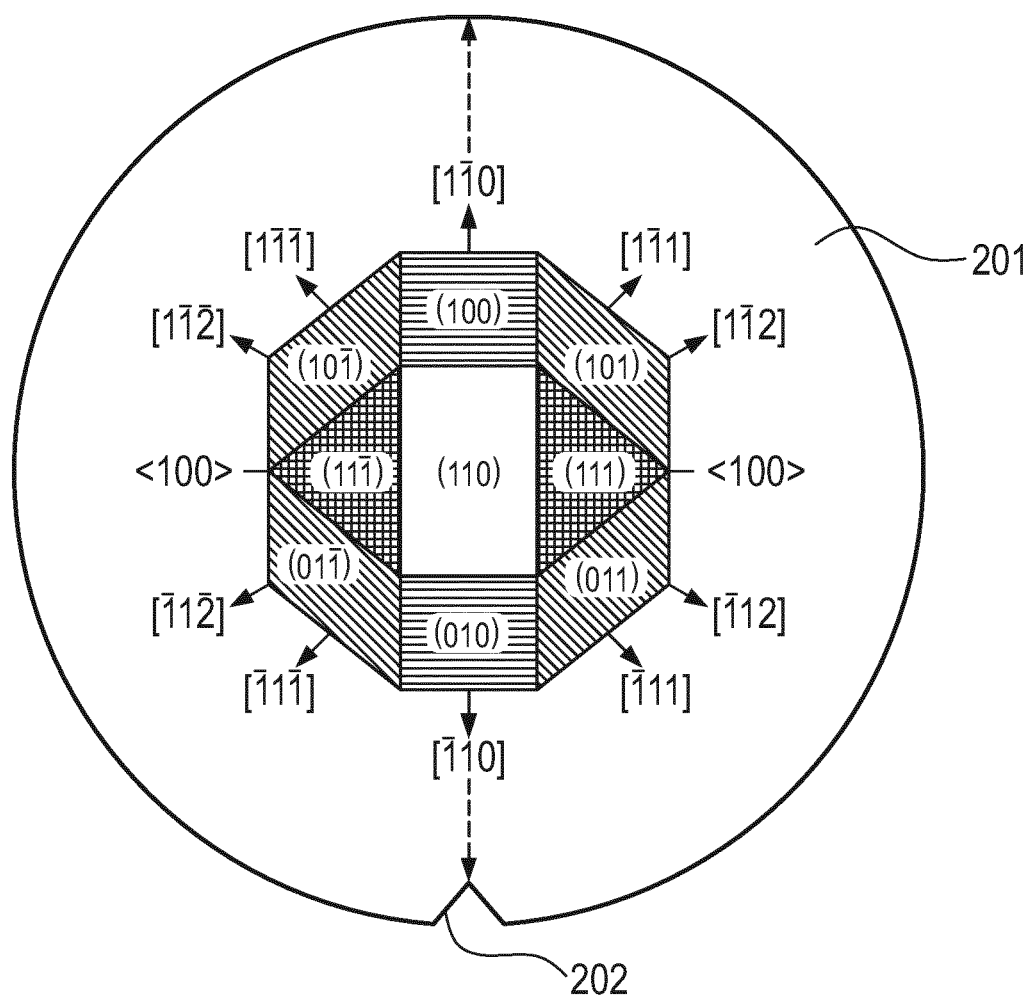
FIG. 2 shows, in line with FIG. 1, a top view of a wafer (201) with <110> orientation having an orientation notch (202).
Figure 3:
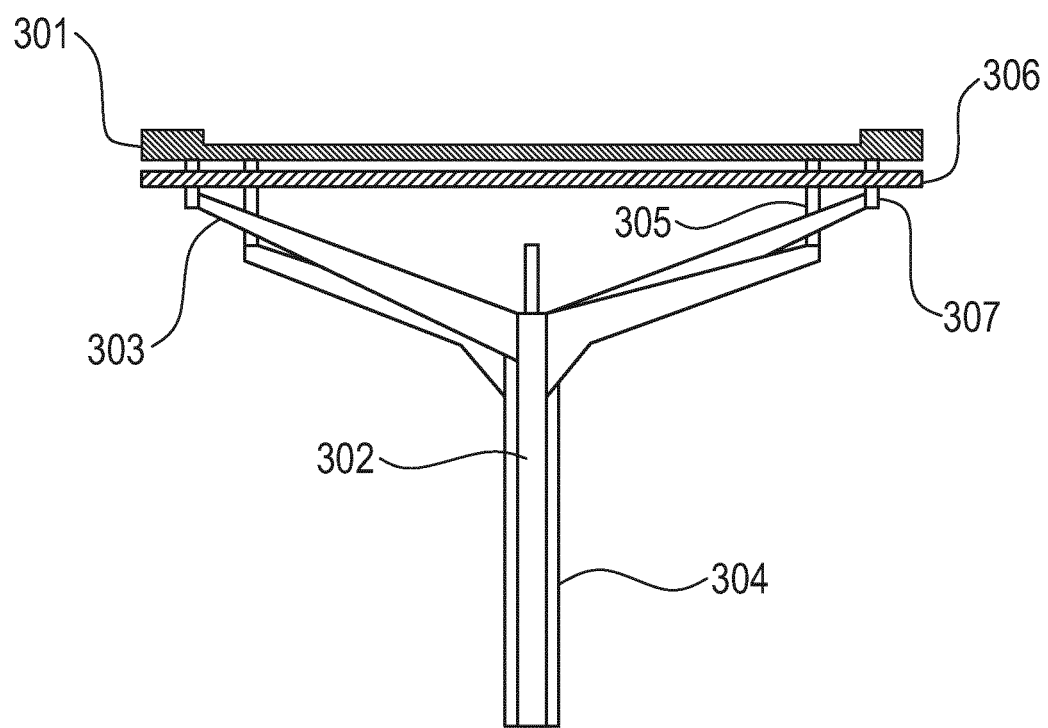
FIG. 3 illustrates one embodiment of the invention, showing the centrally rotatable susceptor and ring.

A device (FIG. 3) according to the invention comprises not only a susceptor (301), but also a mechanism for holding and rotating the susceptor (301) having a susceptor support shaft (302) and susceptor support arms (303). Furthermore, the mechanism for holding and rotating the susceptor (301) can comprise a wafer lift shaft (304) and wafer lift pins (305). An essential feature of the device is a ring (306) which is held by the susceptor support arms (303) and is arranged under the susceptor (301) without having direct contact with the susceptor (301). The ring (306) is held by the susceptor support arms (303) such that it cannot be shifted along its circumferential direction. Preferably, susceptor support pins (307), which are inserted through holes (402, 502, 602) in the ring (306), are situated on the susceptor support arms (303). The distance between an upper face of the ring (306) and a lower face of the susceptor (301) is preferably not less than 5 mm and not more than 10 mm.

Figure 4:
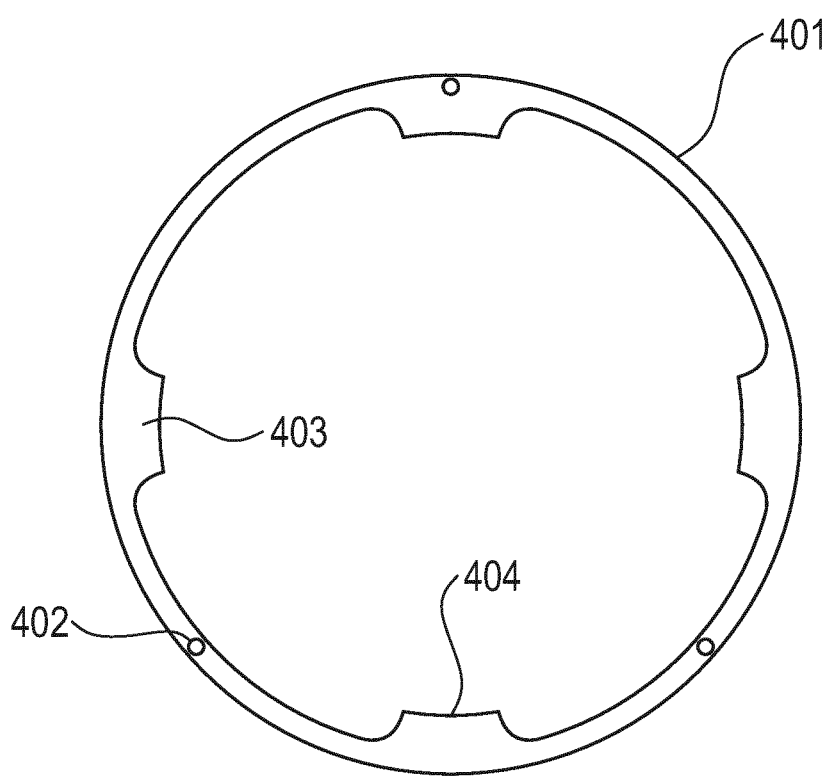
FIG. 4 illustrates a further embodiment of the invention.

FIG. 4 shows a top view of a ring (401) which, in the embodiment shown, has holes (402) and four inwardly pointing projections (403) which are arranged so as to be distributed across the circumference at an interval of 90°. This embodiment is suitable for use in a device as per FIG. 3 for depositing therein, according to the invention, an epitaxial layer on the front side of a wafer having a <100> orientation. Preferably, the ring (401) consists of quartz glass and the projections (403) consist of a material having low transmittance in the IR region of the spectrum. In this region, the transmittance of the projections (403) is preferably not more than 20% and particularly preferably not more than 5%, based on a material thickness of 10 mm. The projections (403) preferably consist of opaque quartz glass.

Figure 5:
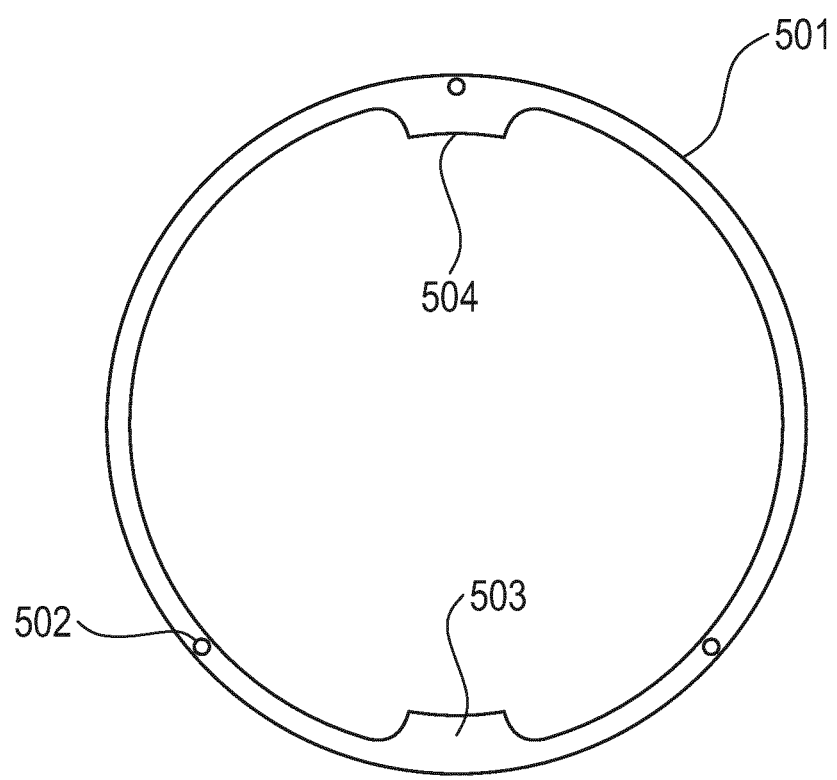
FIG. 5 illustrates a top view of one embodiment of a ring for use in the invention.

FIG. 5 shows a top view of a ring (501) which, in the embodiment shown, has holes (502) and two inwardly pointing projections (503) which are arranged so as to be distributed across the circumference at an interval of 180°. This embodiment is suitable for use in a device as per FIG. 3 for depositing therein, according to the invention, an epitaxial layer on the front side of a wafer having a <110> orientation.

Preferably, an inner edge (404, 504) of the projection (403, 503) of the ring (401, 501) is situated at a radial position, the distance of which in relation to a centre Z of the ring (401, 501) is not less than 140 mm, preferably not less than 145 mm and particularly preferably 148 mm to 150 mm.

Figure 6:
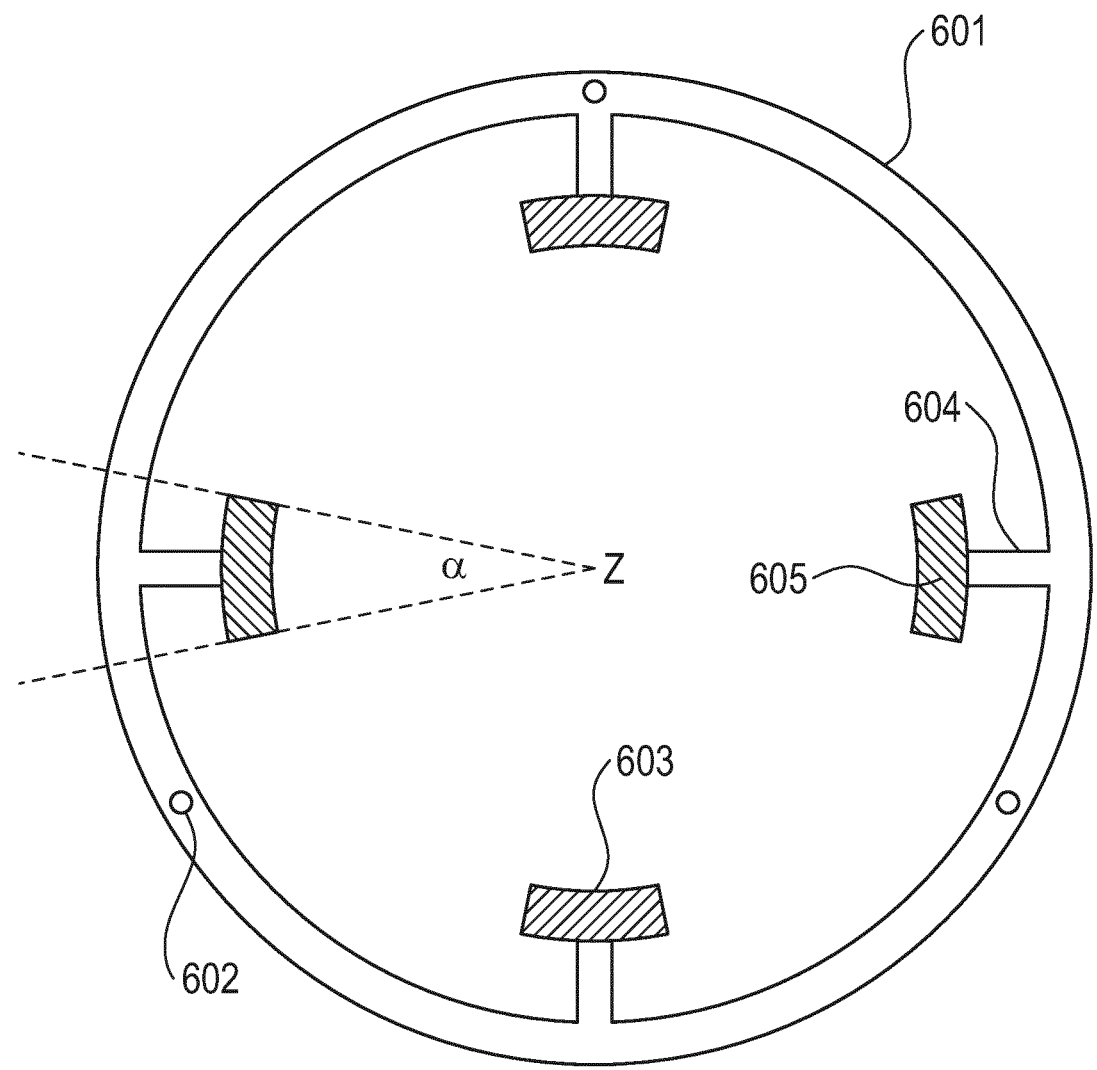
FIG. 6 illustrates a top view of a further embodiment of a ring in accordance with the invention.

FIG. 6 shows a top view of a ring (601) which, in the embodiment shown, has holes 602 and four inwardly pointing projections (603) which are arranged so as to be distributed across the circumference at an interval of 90°. This embodiment is suitable for use in a device as per FIG. 3 for depositing therein, according to the invention, an epitaxial layer on the front side of a wafer having a <100> orientation. In the embodiment depicted, the projections (603) are T-shaped and each comprise a web (604) and a ring segment (605). The ring segment (605) has a radial length and a width in the circumferential direction. The radial length is preferably not less than 3 mm and not more than 8 mm. Expressed as opening angle α, the width is preferably not less than 15° and not more than 25° and most preferably 20°. Preferably, the ring (601) and/or the webs (604) consist of quartz glass and the ring segments consist of a material having low transmittance in the IR region of the spectrum. In this region, the transmittance of the ring segment (605) is preferably not more than 20% and particularly preferably not more than 5%, based on a material thickness of 10 mm. The ring segments (605) preferably consist of opaque quartz glass.

Figure 7:
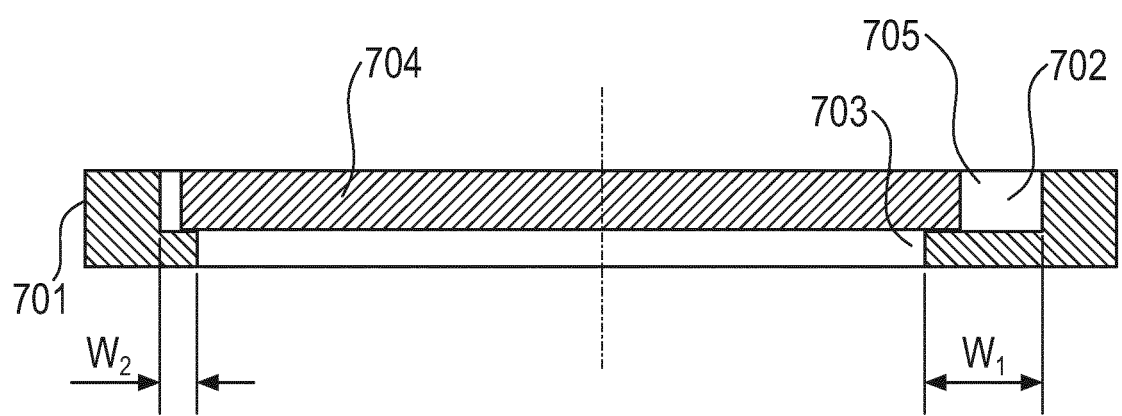
FIGS. 7 and 8 illustrate a susceptor ring of the invention.
Figure 8:
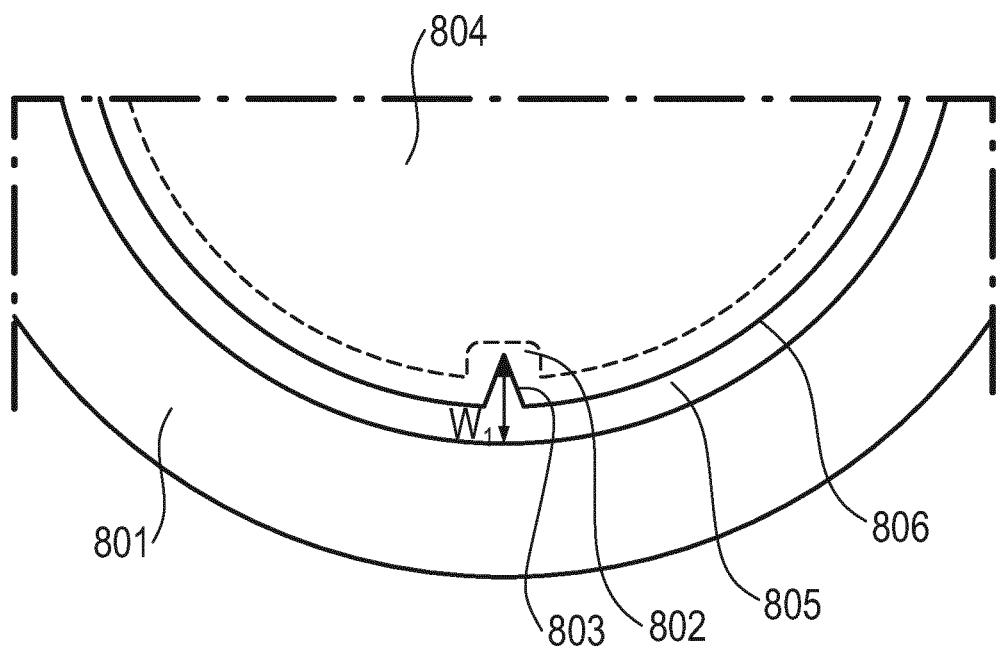

FIGS. 7 and 8 show a susceptor ring (701, 801) having a resting face (703, 805) and the adjacent stepped boundary (702, 806). One embodiment of a susceptor ring (701, 801) according to the invention envisages that the resting face has an inwardly pointing projection. This means that the radial width $W_1$ of the resting face (703, 805) of the susceptor ring (701, 801) at an azimuthal position is greater than the radial width $W_2$ at the opposite position.

In addition, a wafer (704, 804) can preferably be positioned in the susceptor ring (701, 801) such that the position with the greatest width of the resting face $W_1$ (802) coincides with the position of the orientation notch (803).

Figure 9:
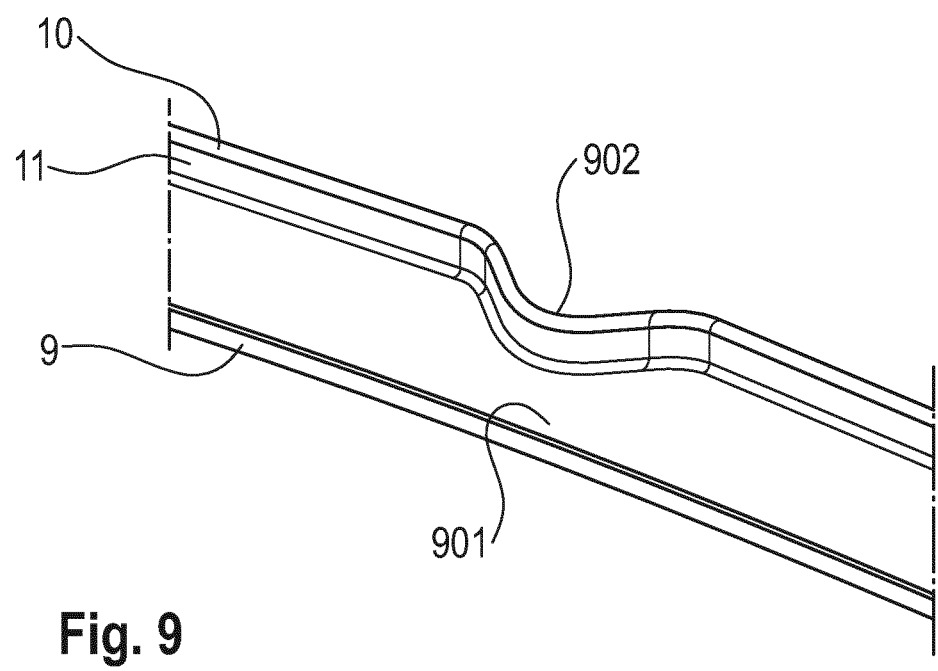
FIG. 9 illustrates an inwardly pointing bulge in the wall of a wafer-receiving pocket in a susceptor.

In addition, the stepped boundary (FIG. 9, 901) adjacent to the rest can preferably be realized such that it has an inwardly pointing bulge (FIG. 9, 902).

Preferably, the azimuthal position of an inwardly pointing bulge of the stepped boundary (902) adjacent to the rest is identical to the azimuthal position of the inwardly pointing projection of the resting face (403, 503).

To deposit an epitaxial layer on a front side of a wafer composed of monocrystalline material, the wafer is preferably arranged in the described device such that the orientation notch of the wafer has the same azimuthal position as a projection of the ring. Thereafter, the wafer is brought to a deposition temperature by means of thermal radiation which is directed towards a front side and towards a back side of the wafer and deposition gases are conducted across the front side of the wafer.

Said deposition gases preferably contain silanes, chlorosilanes or mixtures thereof, diluted in a carrier gas (preferably hydrogen).

What is understood by said deposition temperature is the temperature at which a layer is deposited on the wafer under the given boundary conditions.

The means of the described device ensure the selective reduction of the intensity of a portion of the thermal radiation which is directed towards the back side of the wafer, the result being that first subregions on the edge of the wafer, in which a growth rate of the epitaxial layer at uniform temperature of the wafer is greater because of the orientation of the monocrystalline material, are heated more weakly than in adjacent second subregions.

The above description of exemplary embodiments is to be understood exemplarily. The disclosure made thereby firstly enables a person skilled in the art to understand the present invention and the associated advantages and secondly encompasses alterations and modifications to the described structures and methods that are also obvious in the understanding of a person skilled in the art. Therefore, all such alterations and modifications and also equivalents are to be covered by the scope of protection of the claims.

Figure 10:
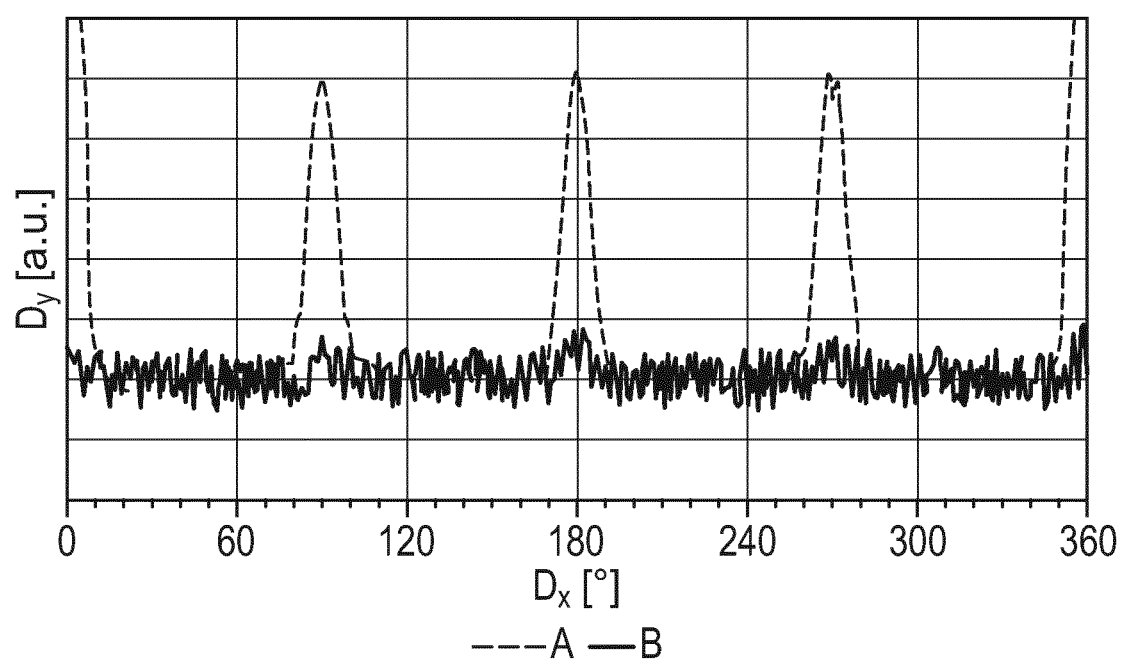
FIG. 10 illustrates an improvement in wafer geometry which may be achieved by the invention.

FIG. 10 illustrates the effect achieved by use of the method according to the invention in epitaxy. Here, the azimuthal coordinates in degrees [°] are plotted on the x-axis $D_x$. The y-axis $D_y$ shows layer thickness in dimensionless coordinates, which are measured along a perimeter of the wafer. Dashed line A represents the height curve which can be achieved using prior-art methods. Solid line B is achieved by use of the method according to the invention. The orientation notch was situated at position 0°, or 360°.

The invention claimed is:
1. A device for depositing an epitaxial layer on a front side of a wafer having an orientation notch, comprising a mechanism for holding and rotating a susceptor, the mechanism having a susceptor support shaft and susceptor support arms; and a ring positioned below the susceptor which is held by the susceptor support arms having a plurality of inwardly pointing projections at regularly spaced azimuthal positions corresponding to crystal orientation directions on the front side of the wafer which exhibit a higher epitaxial growth rate than other crystal orientation directions;

wherein the susceptor comprises a susceptor ring having a resting face for resting the wafer in an edge region of a back side of the wafer on the susceptor ring, a stepped outer boundary adjacent to the resting face, and a radially inward projection of the stepped outer boundary sized to fit within the orientation notch of the wafer, and wherein the resting face has an inwardly pointing projection adjacent to the resting face at the same azimuthal position as the radially inward projection of the stepped outer boundary, and which extends below the orientation notch of the wafer.

2. The device of claim 1, wherein the ring comprises quartz glass.

3. A device for depositing an epitaxial layer on a front side of a wafer having an orientation notch, comprising a mechanism for holding and rotating a susceptor, the mechanism having a susceptor support shaft and susceptor support arms; and a ring positioned below the susceptor which is held by the susceptor support arms, having a plurality of inwardly pointing projections at regularly spaced azimuthal positions corresponding to crystal orientation directions on the front side of the wafer which exhibit a higher epitaxial growth rate than other crystal orientation directions;

wherein the susceptor comprises a susceptor ring having a resting face for resting the wafer in an edge region of a back side of the wafer on the susceptor ring, a stepped outer boundary adjacent to the resting face, and a radially inward projection of the stepped outer boundary sized to fit within the orientation notch of the wafer, and wherein the resting face has an inwardly pointing projection adjacent to the resting face at the same azimuthal position at the radially inward projection of the stepped outer boundary, and which extends below the orientation notch of the wafer, wherein the projections of the ring mare made from a material which selectively reduces an intensity of thermal radiation passing through the projections, such that first subregions on the edge of a wafer resting on the susceptor, in which a growth rate of the epitaxial layer at uniform temperature of the wafer is greater because of the orientation of the monocrystalline material, are heated more weakly than in adjacent second subregions.

4. The device of claim 1, wherein the ring has two inwardly pointing projections located at 0° and 180° azimuthal positions relative to the position of orientation notch, or four inwardly pointing projections located at 0°, 90°, 180°, and 270° azimuthal positions relative to the position of the orientation notch.

5. A method for depositing an epitaxial layer on a front side of a wafer composed of monocrystalline material, comprising providing a wafer having an orientation notch;

arranging the wafer on a device comprising a mechanism for holding and rotating a susceptor, the mechanism having a susceptor support shaft and susceptor support arms; and a ring positioned below the susceptor which is held by the susceptor support arms and has one or more inwardly pointing projections at corresponding one or more azimuthal positions corresponding to crystal orientation directions on the front side of the wafer which exhibit a higher epitaxial growth rate than other crystal orientation directions;

wherein the susceptor comprises a susceptor ring having a resting face for resting the wafer in an edge region of a back side of the wafer on the susceptor ring, and a stepped outer boundary, and wherein wherein the orientation notch of the wafer has the same azimuthal position as an inwardly pointing projection of the ring;

heating the wafer to a deposition temperature by means of thermal radiation which is directed towards a front side and towards a back side of the wafer;

rotating the wafer about its center;

conducting a deposition gas across the front side of the wafer; and selectively reducing the intensity of a portion of the thermal radiation which is directed towards the back side of the wafer by the one or more inwardly pointing projections, of the ring positioned below the susceptor such that first subregions on the edge of the wafer, in which a growth rate of the epitaxial layer at uniform temperature of the wafer is greater because of the orientation of the monocrystalline material, are heated more weakly than in adjacent second subregions.

6. The method of claim 5, wherein the intensity of the portion of the thermal radiation is selectively reduced by arranging material having low transmittance in the IR region of the spectrum in the beam path of the thermal radiation.

7. The device of claim 1, wherein the plurality of inwardly pointing projections of the ring positioned below the susceptor have an inner edge which is not less than 140 mm from a center Z of the ring.

8. The device of claim 1, wherein the ring is positioned from 5 mm to 10 mm below the susceptor ring.

9. The method device of claim 5, wherein the plurality of inwardly pointing projections of the ring positioned below the susceptor have an inner edge which is not less than 140 mm from a center Z of the ring.

10. The method of claim 5, wherein the ring is positioned from 5 mm to 10 mm below the susceptor ring.

* * * * *

UNITED STATES PATENT AND TRADEMARK OFFICE
CERTIFICATE OF CORRECTION

PATENT NO.         : 11,982,015 B2
APPLICATION NO.    : 17/614214
DATED              : May 14, 2024
INVENTOR(S)        : Joerg Haberecht et al.

Page 1 of 1

It is certified that error appears in the above-identified patent and that said Letters Patent is hereby corrected as shown below:

In the Claims

Column 5, Line 49, Claim 3:
After "the projections of the ring"
Delete "mare" and
Insert -- are --.

Signed and Sealed this
Twenty-ninth Day of October, 2024

Katherine Kelly Vidal
*Director of the United States Patent and Trademark Office*